US010483184B1

(12) United States Patent
Herrault et al.

(10) Patent No.: US 10,483,184 B1
(45) Date of Patent: Nov. 19, 2019

(54) RECURSIVE METAL EMBEDDED CHIP ASSEMBLY

(71) Applicant: HRL Laboratories, LLC, Malibu, CA (US)

(72) Inventors: Florian G. Herrault, Agoura Hills, CA (US); Miroslav Micovic, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/951,875

(22) Filed: Apr. 12, 2018

Related U.S. Application Data

(62) Division of application No. 15/299,348, filed on Oct. 20, 2016, now Pat. No. 10,026,672.

(Continued)

(51) Int. Cl.
*H01L 23/495* (2006.01)
*H01L 21/00* (2006.01)
(Continued)

(52) U.S. Cl.
CPC ...... *H01L 23/3675* (2013.01); *H01L 21/4882* (2013.01); *H01L 23/3736* (2013.01)

(58) Field of Classification Search
CPC .................. H01L 23/3675; H01L 23/3736
(Continued)

(56) References Cited

U.S. PATENT DOCUMENTS 3,681,513 A  8/1972 Hargis
4,159,221 A  6/1979 Schuessler
(Continued)

OTHER PUBLICATIONS

From U.S. Appl. No. 15/299,348 (currently unpublished), Non-final Office Action dated Sep. 27, 2017.
(Continued)

*Primary Examiner* — Calvin Lee
(74) *Attorney, Agent, or Firm* — Ladas & Parry

(57) ABSTRACT

A recursive metal-embedded chip assembly (R-MECA) process and method is described for heterogeneous integration of multiple die from diverse device technologies. The recursive aspect of this integration technology enables integration of increasingly-complex subsystems while bridging different scales for devices, interconnects and components. Additionally, the proposed concepts include high thermal management performance that is maintained through the multiple recursive levels of R-MECA, which is a key requirement for high-performance heterogeneous integration of digital, analog mixed signal and RF subsystems. At the wafer-scale, chips from diverse technologies and different thicknesses are initially embedded in a metal heat spreader surrounded by a mesh wafer host. An embodiment uses metal embedding on the backside of the chips as a key differentiator for high-density integration, and built-in thermal management. After die embedding, wafer-level front side interconnects are fabricated to interconnect the various chips and with each other. The wafer is then diced into individual metal-embedded chip assembly (MECA) modules, and forms the level one for multi-scale R-MECA integration. These modules are subsequently integrated into another wafer or board using the same integration approach recursively. Additional components such as discrete passive resistors, capacitors and inductors can be integrated at the second level, once the high-resolution, high-density integration has been performed at level zero. This recursive integration offers a practical solution to build very large scale integrated systems and subsystems.

34 Claims, 11 Drawing Sheets

Related U.S. Application Data

(60) Provisional application No. 62/244,659, filed on Oct. 21, 2015.

(51) Int. Cl.
  *H01L 23/367* (2006.01)
  *H01L 23/373* (2006.01)
  *H01L 21/48* (2006.01)

(58) Field of Classification Search
  USPC ........ 438/121, 122; 257/625, 675, 706, 720, 257/796
  See application file for complete search history.

(56) References Cited

U.S. PATENT DOCUMENTS

| | | |
|---|---|---|
| 5,073,521 A | 12/1991 | Braden |
| 5,198,385 A | 3/1993 | Devitt et al. |
| 5,262,351 A | 11/1993 | Bureau et al. |
| 5,276,455 A | 1/1994 | Fitzsimmons et al. |
| 5,371,404 A | 12/1994 | Juskey et al. |
| 5,583,377 A | 12/1996 | Higgins |
| 5,953,594 A | 9/1999 | Bhatt et al. |
| 6,018,459 A | 1/2000 | Carlson et al. |
| 6,028,367 A | 2/2000 | Yu |
| 6,249,439 B1 | 6/2001 | DeMore et al. |
| 6,900,765 B2 | 5/2005 | Navarro et al. |
| 6,989,592 B2 | 1/2006 | Chang et al. |
| 7,015,060 B1 | 3/2006 | Kubena et al. |
| 7,067,397 B1 | 6/2006 | Chang-Chien et al. |
| 7,271,479 B2 | 9/2007 | Zhao et al. |
| 7,292,381 B1 | 11/2007 | Patterson et al. |
| 7,364,063 B2 | 4/2008 | Schaenzer et al. |
| 7,683,469 B2 | 3/2010 | Oh et al. |
| 7,733,265 B2 | 6/2010 | Margomenos et al. |
| 7,777,315 B2 | 8/2010 | Noquil |
| 7,808,013 B2 | 10/2010 | Mendendorp, Jr. et al. |
| 7,947,906 B2 | 5/2011 | Lee et al. |
| 8,013,434 B2 | 9/2011 | Lin et al. |
| 8,093,690 B2 | 1/2012 | Ko et al. |
| 8,178,963 B2 | 5/2012 | Yang |
| 8,178,964 B2 | 5/2012 | Yang |
| 8,241,962 B2 | 8/2012 | Lin et al. |
| 8,334,592 B2 | 12/2012 | Bhagwagar et al. |
| 8,375,576 B2 | 2/2013 | Kwon |
| 8,580,608 B2 | 11/2013 | Hsu et al. |
| 8,617,927 B1 | 12/2013 | Margomenos et al. |
| 8,644,020 B2 | 2/2014 | Lau et al. |
| 8,664,043 B2 * | 3/2014 | Ewe ................... H01L 23/5389 438/110 |
| 8,754,522 B2 | 6/2014 | Meyer et al. |
| 8,759,147 B2 | 6/2014 | Choi |
| 8,927,339 B2 | 1/2015 | Lin et al. |
| 9,040,420 B2 | 5/2015 | Sugiyama et al. |
| 9,059,140 B1 | 6/2015 | Margomenos et al. |
| 9,214,404 B1 | 12/2015 | Margomenos et al. |
| 9,275,955 B2 * | 3/2016 | Mahajan ............ H01L 23/5381 257/787 |
| 9,318,411 B2 * | 4/2016 | Lin ........................ H01L 24/97 |
| 9,337,124 B1 | 5/2016 | Herrault et al. |
| 9,385,083 B1 | 7/2016 | Herrault et al. |
| 9,508,652 B1 | 11/2016 | Herrault et al. |
| 9,837,372 B1 | 12/2017 | Herrault et al. |
| 9,842,814 B1 | 12/2017 | Herrault et al. |
| 2003/0006499 A1 | 1/2003 | Choi |
| 2004/0126931 A1 | 7/2004 | Hembree |
| 2005/0077596 A1 | 4/2005 | Bauer et al. |
| 2005/0077614 A1 | 4/2005 | Chengalva et al. |
| 2005/0155752 A1 | 7/2005 | Larson et al. |
| 2006/0027635 A1 | 2/2006 | Schaenzer et al. |
| 2006/0091509 A1 | 5/2006 | Zhao et al. |
| 2006/0157223 A1 | 7/2006 | Gelorme et al. |
| 2006/0292747 A1 | 12/2006 | Loh |
| 2007/0015666 A1 | 1/2007 | Thieme et al. |
| 2007/0075420 A1 | 4/2007 | Lu et al. |
| 2007/0247851 A1 | 10/2007 | Villard |
| 2007/0290326 A1 | 12/2007 | Yang et al. |
| 2008/0099770 A1 | 5/2008 | Mendendorp et al. |
| 2008/0128897 A1 | 6/2008 | Chao |
| 2008/0179725 A1 | 7/2008 | Chia et al. |
| 2008/0298021 A1 | 12/2008 | Ali et al. |
| 2009/0108437 A1 | 4/2009 | Raymond |
| 2009/0134421 A1 | 5/2009 | Negley |
| 2009/0294941 A1 | 12/2009 | Oh et al. |
| 2009/0309209 A1 | 12/2009 | Chen |
| 2010/0140799 A1 | 6/2010 | Do et al. |
| 2010/0283144 A1 | 11/2010 | Liang |
| 2010/0285637 A1 | 11/2010 | Khan et al. |
| 2010/0320588 A1 | 12/2010 | Dahilig et al. |
| 2010/0327465 A1 | 12/2010 | Shen et al. |
| 2011/0049558 A1 | 3/2011 | Lin et al. |
| 2011/0059578 A1 | 3/2011 | Lin et al. |
| 2011/0248389 A1 * | 10/2011 | Yorita ................. H01L 23/3677 257/659 |
| 2011/0291249 A1 | 12/2011 | Chi et al. |
| 2012/0129298 A1 | 5/2012 | Lin et al. |
| 2012/0139095 A1 | 6/2012 | Manusharow et al. |
| 2012/0217627 A1 | 8/2012 | Tseng et al. |
| 2012/0241942 A1 | 9/2012 | Ihara |
| 2012/0276403 A1 | 11/2012 | Nakagawa et al. |
| 2013/0093085 A1 | 4/2013 | Seah |
| 2014/0084445 A1 | 3/2014 | Lin |
| 2014/0332974 A1 | 11/2014 | Schuckman et al. |
| 2015/0007965 A1 | 1/2015 | Joshi |
| 2016/0050771 A1 * | 2/2016 | Yu ........................ H05K 1/0204 29/852 |

OTHER PUBLICATIONS

From U.S. Appl. No. 15/299,348 (currently unpublished), Requirement for Restriction dated Jun. 19, 2017.

From U.S. Appl. No. 15/169,591 (now U.S. Pat. No. 9,837,372), Notice of Allowance dated May 12, 2017.

From U.S. Appl. No. 15/169,591, Notice of Allowance dated Jul. 28, 2017.

From U.S. Appl. No. 15/169,591, Notice of Allowance dated Oct. 2, 2017.

From U.S. Appl. No. 14/703,545, Notice of Allowance dated Jun. 1, 2017.

From U.S. Appl. No. 14/703,545, Notice of Allowance dated Jun. 26, 2017.

From U.S. Appl. No. 14/286,923 (unpublished; non-publication requested) Final Office Action dated May 17, 2017.

Woo et al, "Effects of Various Metal Seed Layers on the Surface Morphology and Structural Composition of the Electroplated Copper Layer", Apr. 2009, Metals and Materials International, vol. 15, No. 2, pp. 293-297.

Brown, D.F. et al., "High-speed, enhancement-mode GaN power switch with regrown n+ GaN ohmic contacts and staircase field plates," IEEE Electron Device Letters, vol. 34, No. 9, pp. 1118-1120, Sep. 2013.

Ejeckam, F. et al., "Diamond for enhanced GaN device performance," in Proc. IEEE Intersociety Conference on Thermal and Thermomechanical Phenomena in Electronic Systems (ITherm), Orlando, FL, May 27-30, 2014, pp. 1206-1209.

Faqir, M. et al.,"Improved thermal management for GaN power electronics: Silver diamond composite packages," Microelectronics Reliability, vol. 52, Issue 12, pp. 3022-3025, 2012.

Margomenos, A. et al., "Wafer-level packaging method incorporating embedded thermal management for GaN-based RF front-ends," in Proc. IEEE Intersociety conference on Thermal and Thermomechanical Phenomena in Electronic Systems (ITHERM), Orlando, FL, May 27-30, 2014, pp. 976-981.

Nochetto, H.C. et al., "GaN HEMT junction temperature dependence on diamond substrate anisotropy and thermal boundary resistance," in Proc. IEEE Compound Semiconductor Integrated Circuit Symposium (CSICS), La Jolla, CA, Oct. 14-17, 2012, pp. 1-4.

(56) References Cited

OTHER PUBLICATIONS

Shinohara, K. et al., "Scaling of GaN HEMTs and Schottky diodes for submillimeter-wave MMIC applications," IEEE Trans. Electron Devices, vol. 60, No. 10, pp. 2982-2996, 2013.
U.S. Appl. No. 13/306,827, Margomenos, et al., filed Nov. 2011.
U.S. Appl. No. 14/054,572, Margomenos, et al., filed Oct. 2013.
U.S. Appl. No. 14/080,691, Margomenos, et al., filed Nov. 2013.
U.S. Appl. No. 14/703,545, Margomenos, et al., filed May 2015.
U.S. Appl. No. 14/720,619, Herrault, et al., filed May 2015.
U.S. Appl. No. 14/286,923, Margomenos et al, May 2014.
U.S. Appl. No. 14/532,761, Herrault et al, Nov. 2014.
Requirement for Restriction issued for U.S. Appl. No. 14/720,619 dated Sep. 28, 2015.
Notice of Allowance issued for U.S. Appl. No. 14/720,619 dated Feb. 24, 2016.
Non-final Office Action issued for U.S. Appl. No. 15/169,591 dated Dec. 2, 2016.
Requirement for Restriction issued for U.S. Appl. No. 13/306,827 dated Jan. 9, 2013.
Non-final Office Action issued for U.S. Appl. No. 13/306,827 dated Mar 7, 2013.
Notice of Allowance issued for U.S. Appl. No. 13/306,827 dated Aug. 15, 2013.
Requirement for Restriction issued for U.S. Appl. No. 14/054,572 dated Jul. 10, 2014.
Non-final Office Action issued for U.S. Appl. No. 14/054,572 dated Sep. 19, 2014.
Notice of Allowance issued for U.S. Appl. No. 14/054,572 dated Feb. 12, 2015.
Requirement for Restriction issued for U.S. Appl. No. 14/080,691 dated Dec. 17, 2014.
Non-final Office Action issued for U.S. Appl. No. 14/080,691 dated Apr. 16, 2015.
Notice of Allowance issued for U.S. Appl. No. 14/080,691 dated Aug. 12, 2015.
Non-final Office Action issued for U.S. Appl. No. 14/286,923 dated Nov. 1, 2016.
Non-final Office Action issued for U.S. Appl. No. 14/703,545 dated Dec. 15, 2015.
Final Office Action issued for U.S. Appl. No. 14/703,545 dated May 24, 2016.
Non-final Office Action issued for U.S. Appl. No. 14/703,545 dated Oct. 3, 2016.
Chen, K. C., et al., "Thermal Management and Novel Package Design of High Power Light Emitting Diodes," National Cheng Kung University, Taiwan, 2008 Electronic Components and Technology Conference, pp. 795-797, (May 2008).
Feeler, R., et al., "Next-Generation Microchannel Coolers," Northrop Grumman, Proceedings of SPIE, vol. 6876, pp. 687608-1-687608-8, (2008).
Herrault F. et al., "Silicon-Packaged GaN Power HEMTs with Integrated Heat Spreaders," Electronic Components and Technology Conference (ECTC), 2015 IEEE 65.sup.th, Conference: (May 26 to May 29, 2015).
Margomenos A. et al., "Novel Packaging, Cooling and Interconnection Method for GaN High Performance Power Amplifiers and GaN Based RF Front-Ends," Proceedings of the 7.sup.th European Microwave Integrated Circuits Conference, pp. 615-618, (Oct. 29-30, 2012).
Margomenos, A. et al., "Wafer-Level Packaging Method Incorporating Embedded Thermal Management for GaN-Based RF Front-Ends," IEEE Intersociety Conference on Thermal and Thermomechanical Phenomena in Electronic Systems (ITHERM), May 27-30, 2014 in Orlando, Florida.
Margomenos, A. et al., "X-Band Highly Efficient GaN Power Amplifier Utilizing Built-In Electroformed Heat Sinks for Advanced Thermal Management," IEEE International Microwave Symposium, pp. 1-4, (Jun. 2-7, 2013).
P. Chang-Chien et al., "MMIC Packaging and Heterogeneous Integration Using Wafer-Scale Assembly," CS Mantech Conference, pp. 143-146, (May 14-17, 2007).
Notice of Allowance issued for U.S. Appl. No. 14/950,667(now U.S. Pat. No. 9,508,652) dated Aug. 2, 2016.
Non-final Office Action issued for U.S. Appl. No. 14/532,761 dated Oct. 6, 2015.
Notice of Allowance issued for U.S. Appl. No. 14/532,761(now U.S. Pat. No. 9,337,124) dated Jan. 15, 2016.
U.S. Appl. No. 14/950,667, Herrault et al.
U.S. Appl. No. 15/169,591, Herrault et al.
U.S. Appl. No. 15/136,835, Herrault et al.

* cited by examiner

RECURSIVE METAL EMBEDDED CHIP ASSEMBLY

CROSS REFERENCE TO RELATED APPLICATIONS

This Application is a divisional filing of and claims priority to and the benefit of U.S. patent application Ser. No. 15/299,348 filed on Oct. 20, 2016, now U.S. patent Ser. No. 10/026,672 issued Jul. 17, 2018, which claims priority to and the benefit of U.S. Ser. No. 62/244,659, filed on Oct. 21, 2015, both of which are incorporated herein by reference. This application is related to U.S. patent application Ser. No. 13/306,827 filed on Nov. 29, 2011, now U.S. Pat. No. 8,617,927 issued Dec. 31, 2013, which is related to U.S. patent application Ser. No. 14/720,619 filed on May 22, 2015, now U.S. Pat. No. 9,385,083 issued Jul. 5, 2016, which is also related to U.S. patent application Ser. No. 14/950,667 filed on Nov. 24, 2015, now U.S. Pat. No. 9,508,652 issued Nov. 29, 2016, which is also related to U.S. patent application Ser. No. 15/169,591 filed on May 31, 2016, now U.S. Pat. No. 9,837,372 issued Dec. 5, 2017, which is incorporated herein by reference.

CROSS REFERENCE TO RELATED APPLICATION

This application is related to U.S. Pat. No. 8,617,927 which is hereby incorporated herein by reference. This application is also related to the U.S. patent application Ser. No. 14/950,667 filed on Nov. 24, 2015 which is hereby incorporated herein by reference. This application is also related to U.S. patent application Ser. No. 15/169,591 filed on May 31, 2016 which is hereby incorporated herein by reference.

TECHNICAL FIELD

The present disclosure is directed in general to wafer level packaging of integrated circuits and in particular to multi-scale and multi-chip integration.

BACKGROUND

A variety of technologies are known for single-level wafer-scale integration. However, some of these include integration of multiple chips but fail to address effective thermal management, which is a major issue in integrating multiple chips. The next step in the technological evolution is the multi-scale integration, particularly one that is easily scalable and this area is yet to be developed due to the compounding thermal management issues that come with this large multi-scale integration.

Historically, wire bonds have been used in the prior art for both connecting contacts on a chip to its package and also for chip to chip connections when multiple chips reside in a single package. In today's technologies, the wire bonds now are so large compared with the device geometries of modern integrated chips (ICs) that their size can make it difficult to couple modern ICs either with pins in the packaging in which the ICs reside or with neighboring ICs when multiple ICs are packaged together.

U.S. Pat. No. 8,617,927 which is incorporated herein, teaches a method of mounting electronic dies or chips into an electroformed heat spreader offering an integrated solution to thermal management at the single-level wafer-scale integration. U.S. application Ser. No. 15/169,591, incorporated herein, addresses another important technology in connecting die to package using electroplated and suspended interconnects over integrated heat spreaders. U.S. application Ser. No. 14/950,667 (141211), which is also incorporated herein, addresses another aspect of the single-level wafer-scale integration of direct IC-to-package wafer-level packaging with integrated thermal heat spreaders. While these technologies address various aspects of single-level wafer-scale integration while offering solutions to thermal management problems, there is a dire need to expand the scope to multi-level wafer-scale integration while at the same time solving the massive thermal management issues that come with this large scale multi-level integration.

SUMMARY OF THE DISCLOSURE

To address one or more of the above-deficiencies of the prior art, one embodiment described in this disclosure provides for a recursive metal-embedded chip assembly (R-MECA) process comprising, assembling two or more component modules face-down on a carrier substrate, wherein component modules each comprise at least one of an assembly prepared using the metal embedded chip assembly (MECA) process, an Integrated Circuit (IC) chip, a macro cell, and a die, embedding a heat spreader material on the assembly, releasing the carrier substrate from the two or more component modules and forming interconnects between the component modules, by forming multilayer interconnects on the side where the carrier substrate was released.

The disclosure covers the product made by the process comprising, dicing of one or more metal embedded chip assembly (MECA) modules, assembling the MECA modules on a carrier substrate with face-down, attaching a packaging substrate, embedding metal by filling the holes in the packaging substrate, releasing the substrate, flipping the wafer and forming interconnects, wherein MECA modules comprise of assemblies prepared using the metal embedded chip assembly process and/or any Integrated Circuit (IC) chips and/or any macro cell and/or a die fabricated in any technology.

The disclosure also provides for a process of integrating discrete components to the MECA modules and recursively using the process described above to achieve a large scale integration with integrated thermal spreaders.

Certain embodiments may provide various technical features depending on the implementation. For example, a technical feature of some embodiments may include the capability to provide for large scale integration of different technology dies.

Although specific features have been enumerated above, various embodiments may include some, none, or all of the enumerated features. Additionally, other technical features may become readily apparent to one of ordinary skill in the art after review of the following figures and description.

BRIEF DESCRIPTION OF THE DRAWINGS

For a more complete understanding of the present disclosure and its features, reference is now made to the following description taken in conjunction with the accompanying drawings, in which like reference numerals represent like parts.

DETAILED DESCRIPTION

Figure 1:
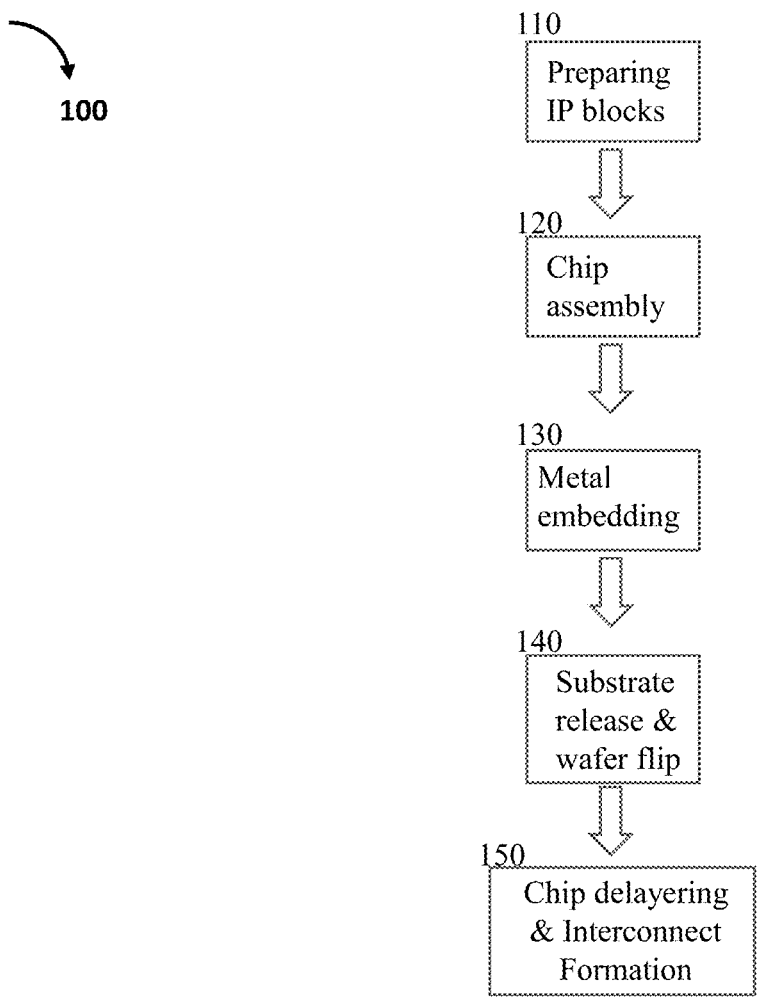
FIG. 1 illustrates a process flow of metal embedded chip assembly (MECA)

It should be understood at the outset that, although example embodiments are illustrated below, the present technology may be implemented using any number of techniques, whether currently known or not. The present technology should in no way be limited to the example implementations, drawings, and techniques illustrated below. Additionally, the drawings are not necessarily drawn to scale.

The proposed technology presents a recursive metal-embedded chip assembly (R-MECA) technology for heterogeneous integration of multiple die from diverse device technologies. One of the features of this disclosure is the "recursive" aspect of this integration technology, which enables integration of increasingly-complex subsystems while bridging different scales for devices, interconnects and components. Additionally, high thermal management performance is maintained through the multiple recursive levels of R-MECA, a key requirement for high-performance heterogeneous integration of digital, analog mixed signal and RF subsystems.

Even today, wire bonding techniques are used when it comes to interconnecting heterogeneous devices. This disclosure introduces a new technology which effectively replaces prior art wire bonding techniques with a new die to package and die to die interconnects which may be conveniently suspended over electrically conductive surfaces such as integrated heat sinks (or heat spreaders) which may be included in the packaging. The new technology is particularly suitable for wafer-level integration and wafer-level processing, which enables parallel interconnection of a multitude of chips at the wafer scale.

In an embodiment of this technology, at the wafer-scale, chips from diverse technologies and different thicknesses are initially embedded in a metal heat spreader surrounded by a mesh wafer serving as a host. The approach uses metal embedding on the backside of the chips as a key differentiator to achieve among other things, high-density integration and built-in thermal management. After die embedding, wafer-level front side interconnects are fabricated to interconnect the various chips with each other. The wafer is then diced into individual MECA modules, and forms the level one for multi-scale R-MECA integration. These modules are subsequently integrated into another wafer or board using the same integration approach recursively. Additional components such as discrete passive resistors, capacitors, inductors can be integrated at the second level, once the high-resolution, high-density integration has been performed at the level zero.

For complex high-power RF subsystems requiring highly integrated heterogeneous device technologies as well as bulky passive components such as discrete off-the-shelf resistors, inductors and capacitors, the proposed technology of Metal Embedded Chip Assembly (MECA) approach is particularly revolutionary because it can be implemented sequentially in a recursive manner (R-MECA) with increasingly complex modules and high-performance thermal management.

Figure 2:
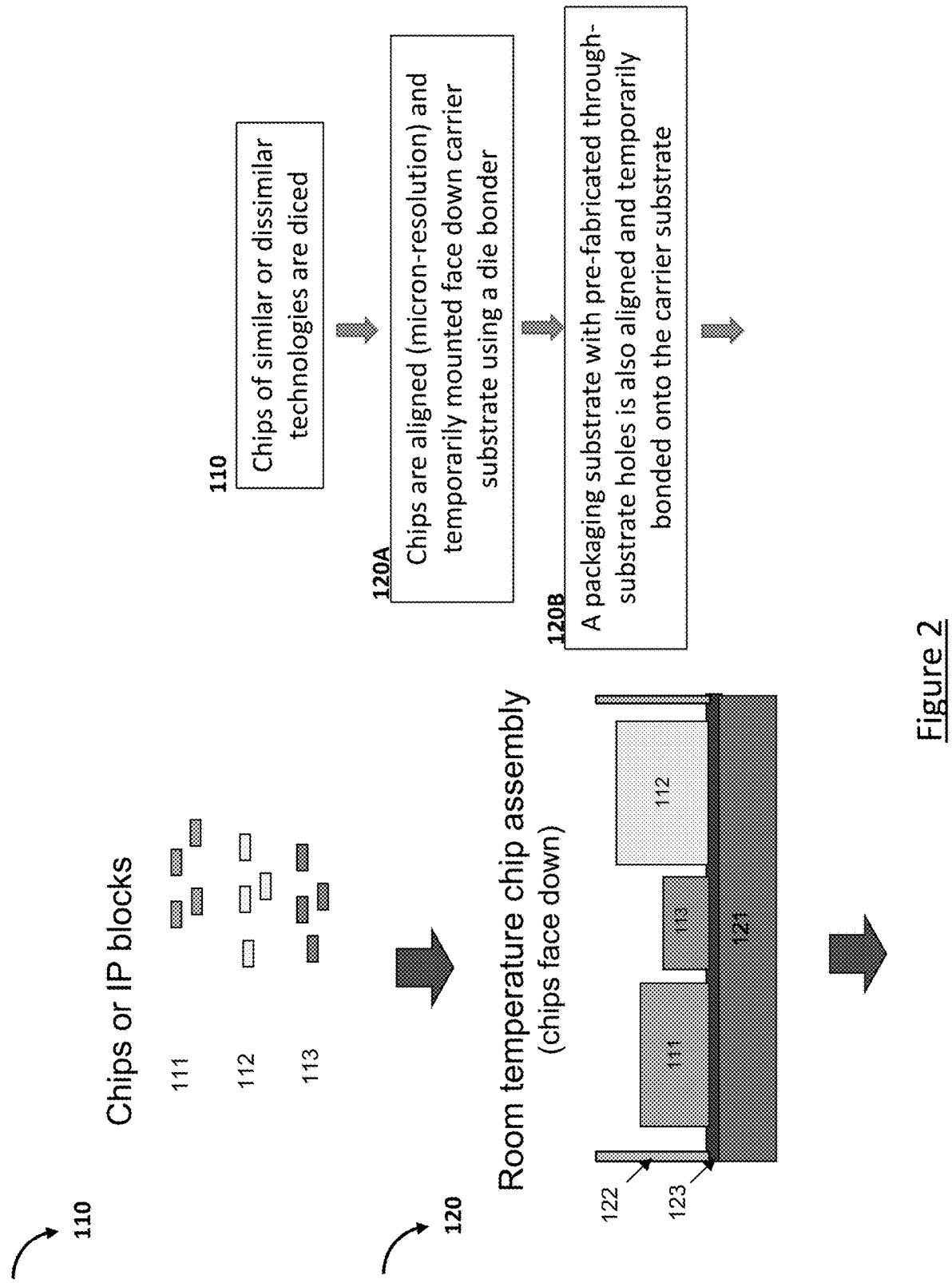
FIGS. 2, 3 and 4 illustrate detailed steps of the process flow in FIG. 1.
Figure 3:
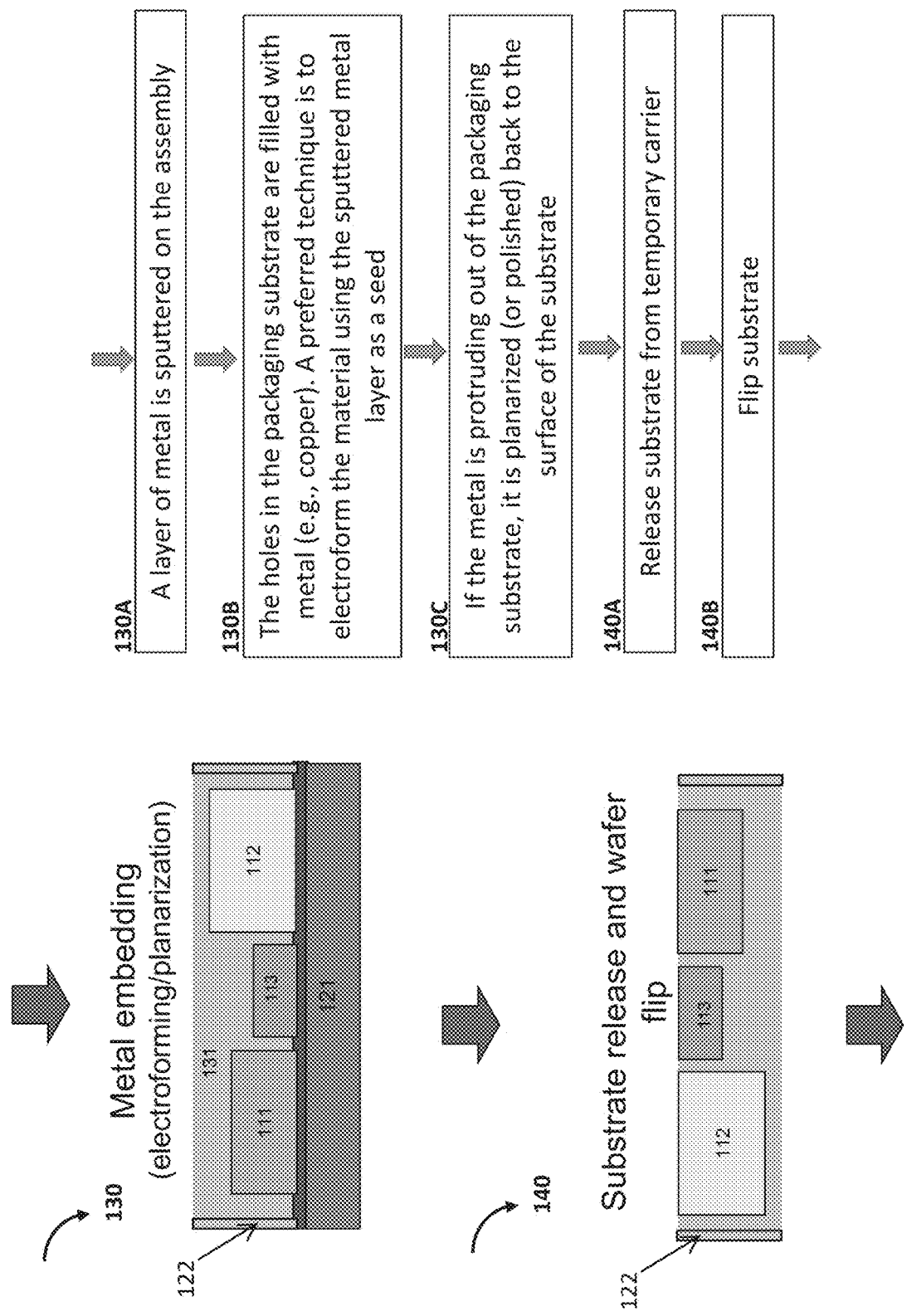
Figure 4:
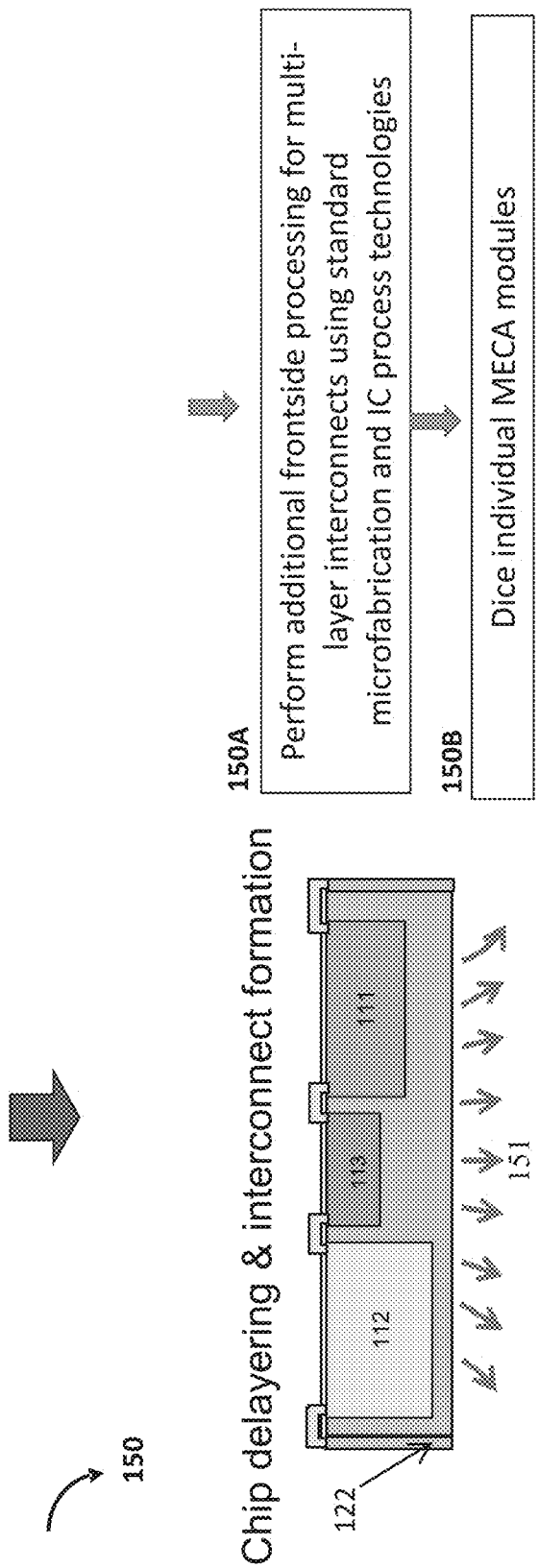

The standard MECA integration process flow 100 is illustrated in FIG. 1. At the highest level, this MECA process flow comprises of preparing various IC chips or IP blocks that make up an integrated chip or a module (110), followed by assembling these blocks on a substrate to form an integrated chip assembly (120), followed by a metal embedding process (130) and subsequently releasing the substrate and flipping the wafer (140). The final step 150 comprises of exposing the pads for forming the interconnects between the various blocks. FIGS. 2, 3 and 4 describe this MECA process steps in detail.

The first step 110 in the MECA process is to dice the IC chips or the IP blocks or macros that need to be put together and interconnected in the MECA process. They can be from one or more different technologies or from the same technology family. In the illustration of FIG. 2, 111 represent a die from an IC chip, while 112 is another die from a different technology and 113 is an IP Macro. They are first diced in step 110. Next step 120 comprises of several sub-steps 120A and 120B. In step 120, IC chips and a mesh wafer (packaging form 122) are only temporarily bonded face down on a carrier wafer coated with adhesive. In step 120A, the dies of chips and macros are mounted on a carrier substrate face down and temporarily bonded using a die bonder 123. Next (in step 120B), a pre-fabricated packaging form 122 with pre-fabricated through-substrate holes is installed, aligned and temporarily bonded onto the carrier substrate 121. This chip assembly on the substrate can take place at room temperature with a die bonder. The packaging form 122 can be made from a substrate or other suitable material.

FIG. 3 illustrates the next two steps, 130 and 140. In step 130, at the wafer level, a high-thermal conductivity (e.g., copper) heat spreader is electroformed on the backside of the chips, enabling high-density chip integration as well as high-performance thermal management due to the intimate contact between the heat spreader and the chips. Step 130 comprises of three sub-steps. In step 130A, a layer of metal, such as copper, is sputtered on the assembly from the step 120B. In the next step 130B, the holes in the packaging substrate 122 are filled with a metal such as copper. In a preferred embodiment, the sputtering of metal in the step 130A is used as a seed layer and then the material of choice is electroformed on top of this seed layer. Planarization (step 130C) takes place after electroforming, to remove any protruding metal. One can use polishing instead or in addition to, in step 130C to get rid of the protruding metal out of the package and to get a smooth finish. Next step 140A involves releasing the substrate 122 from the temporary carrier by any known means, followed by flipping the substrate (step 140B) to get the IC Chips and macros face up and embedded in the metal heat sink 131.

FIG. 4 describes the last step in the MECA process. This step 150 comprises of chip delayering to expose the pads for interconnect and to form the interconnects. Step 150A comprises of any front side processing needed to perform multi-layer interconnects and may use standard IC process technologies and standard micro fabrication technologies to realize high-resolution front side chip-to-chip and chip-to-package interconnects. The final step 150B involves dicing the individual MECA modules as desired.

Such MECA modules can now be further packaged using the same integration approach at a larger scale, where the requirements on chip assembly and interconnect density are not as stringent. This is illustrated in a recursive MECA process described in FIG. 5, according to embodiment 500 of this disclosure. In this recursive MECA process, each of the component modules comprise at least one of an assembly prepared using the metal embedded chip assembly (MECA) process, an Integrated Circuit (IC) chip, a macro cell, and a die. In this illustration of embodiment 500, first two or more MECA modules (MECA_0_A and MECA_0_B etc.) were fabricated using the process illustrated in FIG. 1.

The modules, which feature different IP blocks, and typically different die and interconnect scales, are then integrated using the recursive MECA approach, which is a structured repeat of the process shown in FIG. 1.

Figure 5:
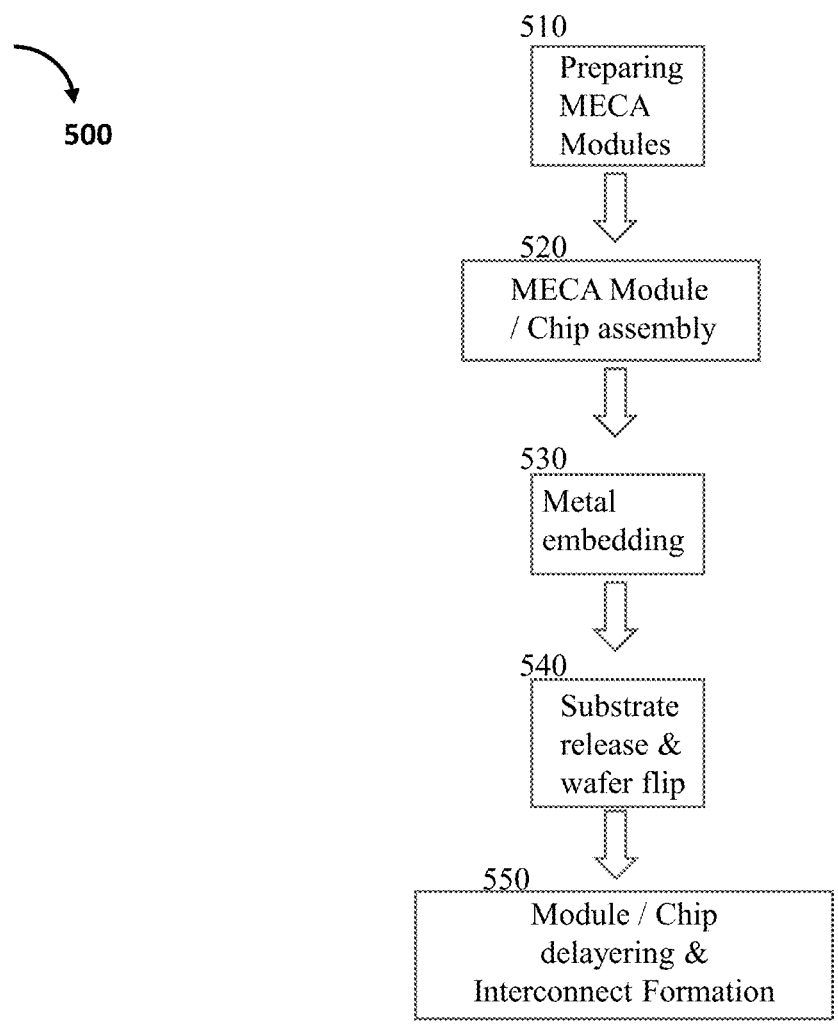
FIG. 5 illustrates a process flow of recursive metal embedded chip assembly (R-MECA), according to an embodiment of the present disclosure.
Figure 6:
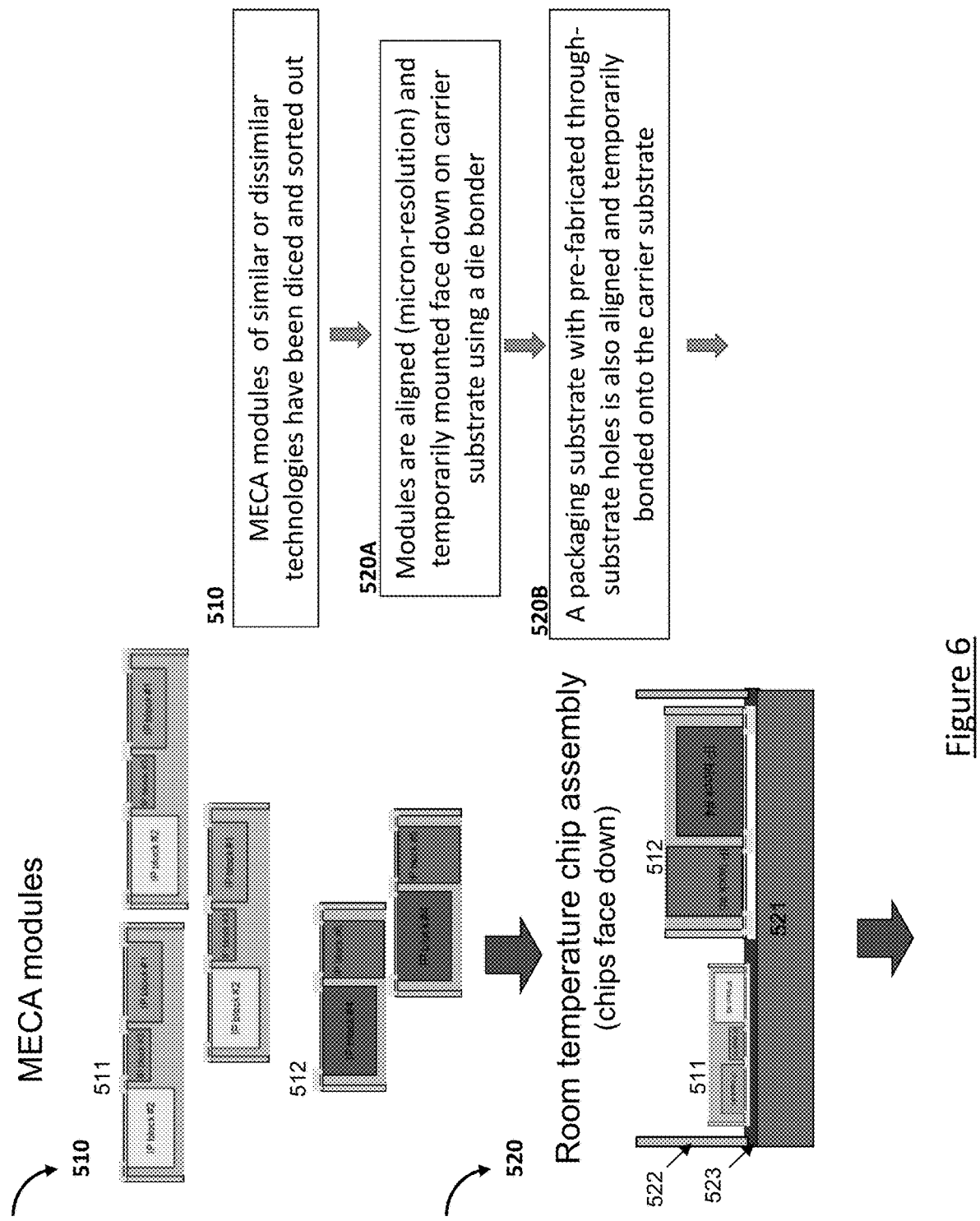
FIGS. 6, 7 and 8 illustrate detailed steps of recursive metal embedded chip assembly (R-MECA) of FIG. 5, according to an embodiment of the present disclosure.
Figure 7:
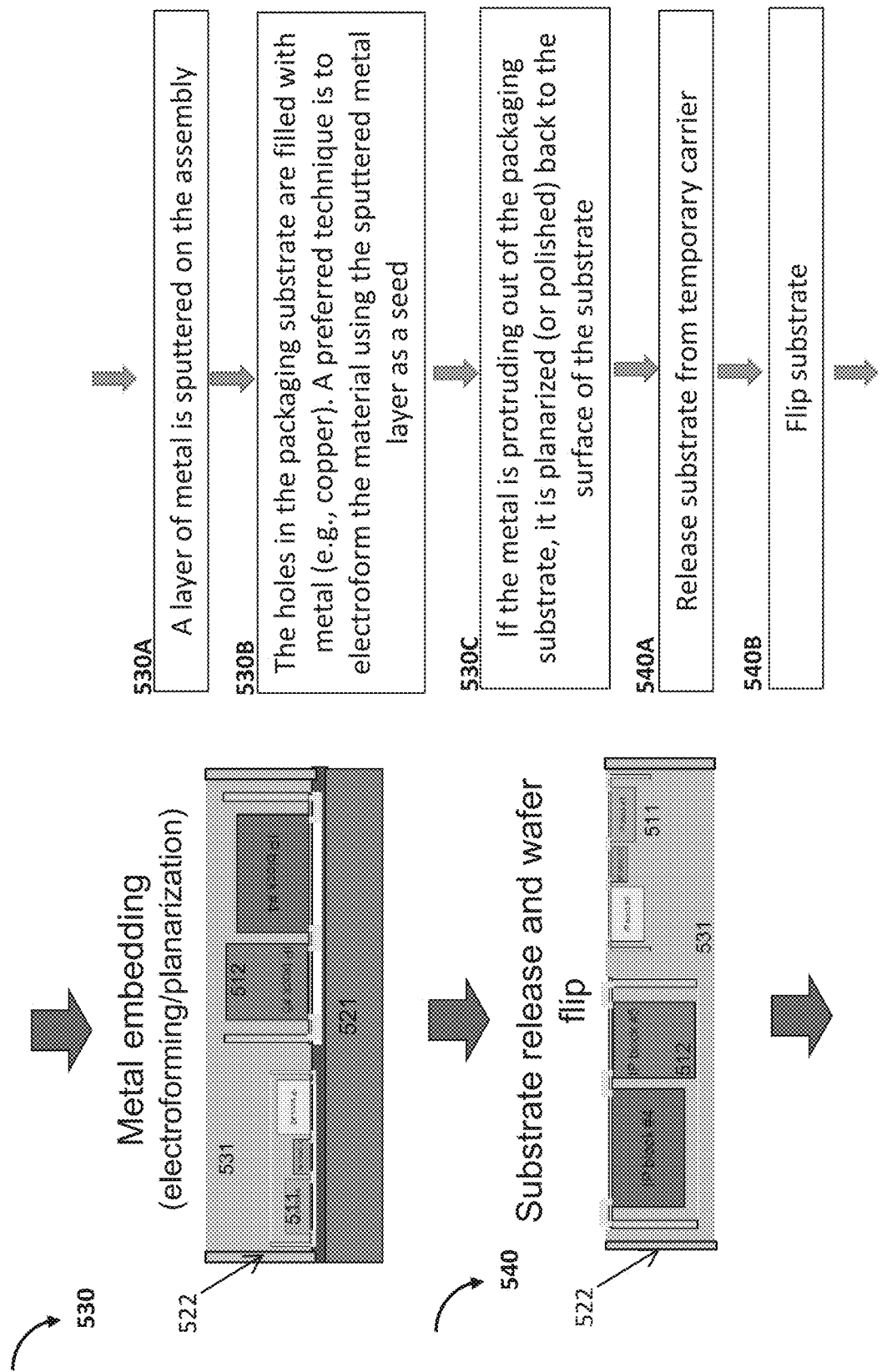
Figure 8:
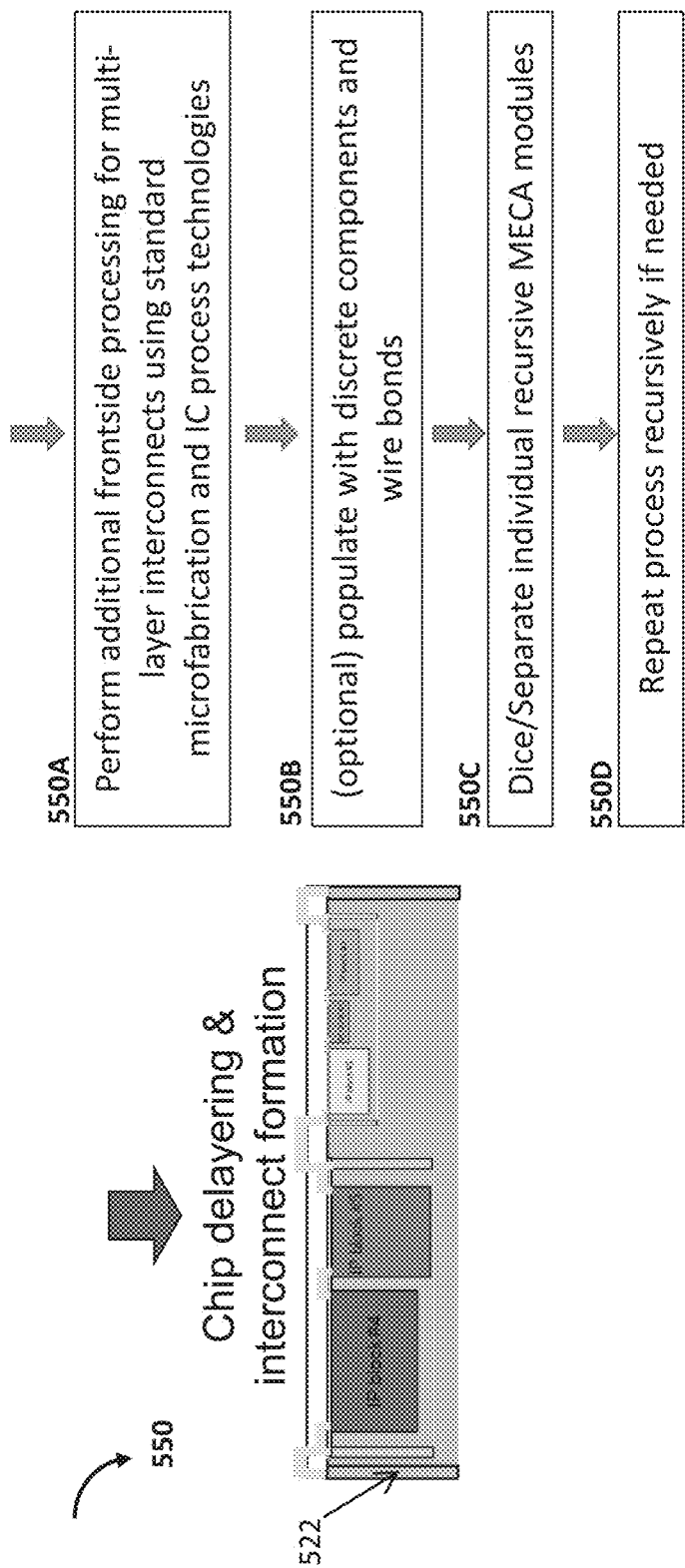

This recursive MECA (R-MECA) process 500 illustrated in FIG. 5 comprises of five major steps. The first step 510 starts off with two or more MECA modules prepared in the process 100 described earlier. This step 510 is followed by assembling these MESA modules on a substrate to form an integrated module assembly (520), followed by a metal embedding process (530) and subsequently releasing the substrate and flipping the wafer (540). The final step 550 comprises of exposing the pads of these integrated MECA modules for forming the interconnects between the various modules. FIGS. 6, 7 and 8 describe this R-MECA process steps in detail. It must be noted that the process 500 not only can integrate several MECA modules, it can also integrate IC chips and IP macros with one or more MECA modules.

The first step 510 in the R-MECA process is to dice and sort out the MECA modules and/or IC chips or the IP blocks or macros of similar or dissimilar technologies that need to be put together and interconnected in the MECA process. In the illustration of FIG. 6, 511 represent a die from a MECA module 1, while 512 is another die from a different technology MECA module. They are first diced in step 510. Next step 520 comprises of several sub-steps 520A and 520B. In step 520, MECA modules and other IC chips or macros and a mesh wafer (packaging substrate 522) are only temporarily bonded face down on a carrier wafer coated with adhesive. In step 520A, the dies of modules and chips are mounted and aligned to micron level resolution on a carrier substrate face down and temporarily bonded using a die bonder 523. Next (in step 520B), a pre-fabricated packaging substrate 522 with pre-fabricated through-substrate holes is installed, aligned and temporarily bonded onto the carrier substrate 521. This R-MECA assembly on the substrate can take place at room temperature with a die bonder.

FIG. 7 illustrates the next two steps, 530 and 540. In step 530, at the wafer level, a high-thermal conductivity (e.g., copper) heat spreader is electroformed on the backside of the assembly, enabling high-density chip integration as well as high-performance thermal management due to the intimate contact between the heat spreader and the assembled MECA modules. Step 530 comprises of three sub-steps. In step 530A, a layer of metal, such as copper, is sputtered on the assembly from the step 520B. In the next step 530B, the holes in the packaging substrate 522 are filled with a metal such as copper. In a preferred embodiment, the sputtering of metal in the step 530A is used as a seed layer and then the material of choice is electroformed on top of this seed layer. Planarization (step 530C) takes place after electroforming, to remove any protruding metal. One can use polishing instead or in addition to, in step 530C to get rid of the protruding metal out of the package and to get a smooth finish. Next step 540A involves releasing the substrate 522 from the temporary carrier by any known means, followed by flipping the substrate (step 540B) to get the MECA modules face up and embedded in the metal heat sink 531.

FIG. 8 describes the last step in the R-MECA process. This step 550 comprises of delayering to expose the pads for interconnect and to form the interconnects between the MECA modules. Step 550A comprises of any front side processing needed to perform multi-layer interconnects and may use standard IC process technologies and standard micro fabrication technologies to realize high-resolution front side module-to-module and module-to-package interconnects. An optional step 550B can be used to populate discrete components such as inductors, resistors and capacitors and wire bond them to this multi-module assembly. Then, in step 550C one can dice and separate the individual recursive MECA modules assembly as desired. The final step 550D is to repeat this recursive process as needed to build and integrate hierarchies (tier-1, tier-2 etc.) of R-MECA module assemblies with integrated heat spreaders.

Figure 9A:
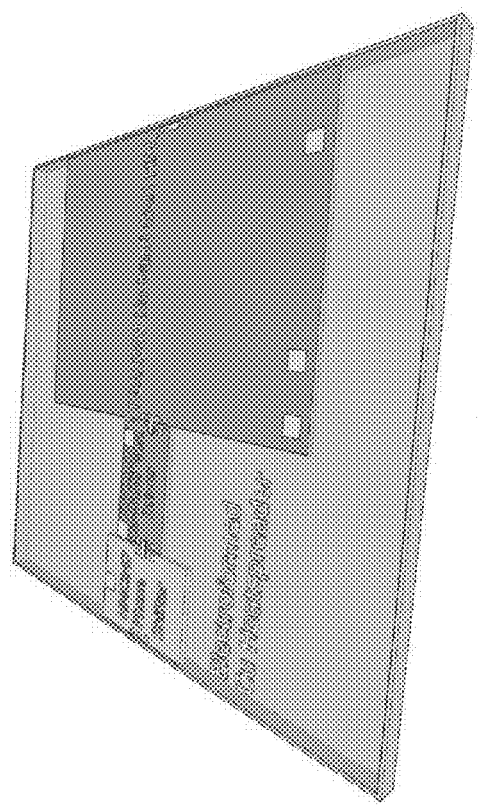
FIG. 9A illustrates multi-chip (COTS) integration in copper electroformed heat spreader with front side interconnects and FIG. 9B illustrates module integration with second embedded heat spreader board-to-MECA_0 interconnects as part of a module integration process flow, according to an embodiment of the present disclosure.
Figure 9B:
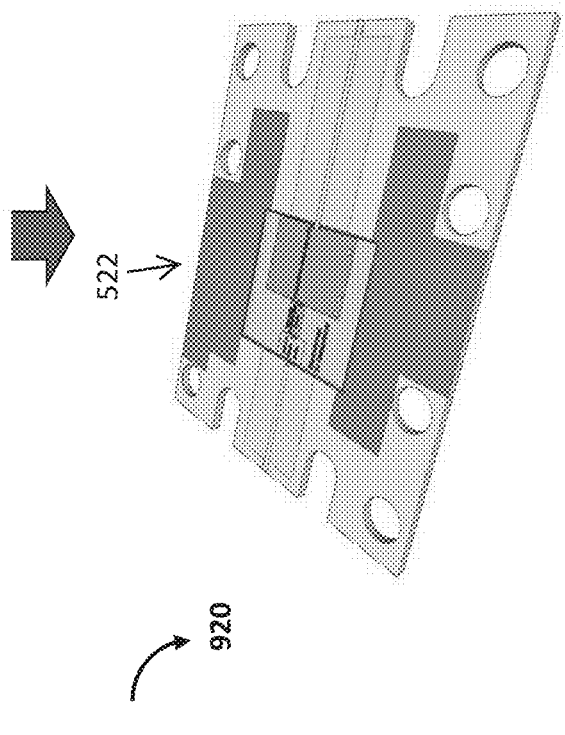

A conceptual schematic of R-MECA featuring two-tier integration is shown in FIG. 9A and FIG. 9B. First, the MECA_0 module is fabricated using the standard MECA process 910 (FIG. 9A), co-assembling multiple bare die in a tightly integrated metal matrix and silicon framework with high-density front side interconnects. Second, each MECA_0 module can then be treated as a complex module and integrated into a second-tier MECA module using a similar process flow 920. The MECA_1 assembly consists of the MECA_0 module embedded in an integrated metallic heat spreader and interconnected through front side electroplated conductors as illustrated in FIG. 9B.

Figure 10A:
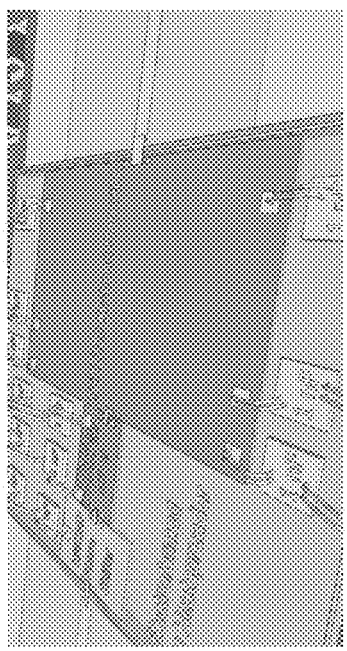
FIG. 10A illustrates integration of discrete components to the assembled module of FIG. 9B, according to an embodiment of the present disclosure.
Figure 10B:
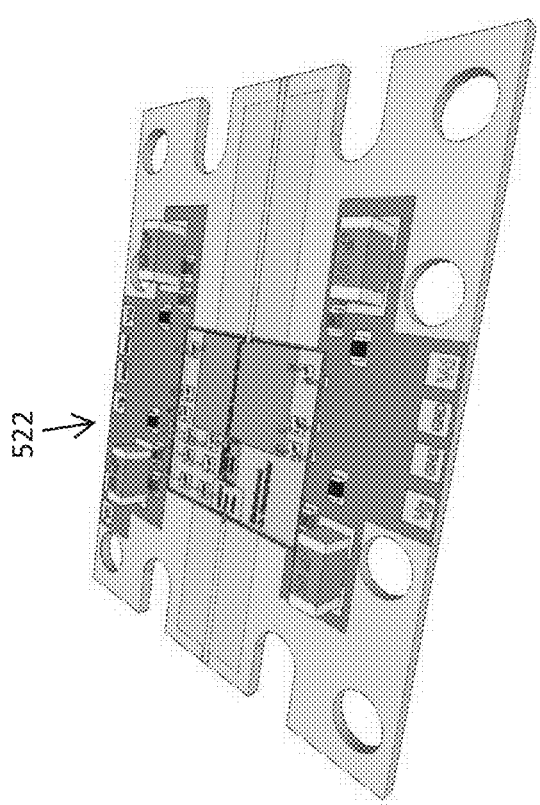
FIG. 10B illustrates a scaled rendering of MECA-integrated Ku-band power amplifier module demonstrating IP re-use through heterogeneous COTS integration according to an embodiment of the present disclosure.

A good example is a second level integration with a printed wiring board since most high-performance electronics require biasing and filtering network that still rely on the use of discrete bulk components such as resistors, capacitors and inductors. This is illustrated in the process flow 1010 illustrated in FIG. 10A. Process method 1020 in FIG. 10B illustrates a scaled rendering of MECA-integrated Ku-band power amplifier module demonstrating module/IC/macro re-use through heterogeneous integration of commercial off-the-shelf components with R-MECA modules recursively, according to an embodiment of the present disclosure.

Figure 11:
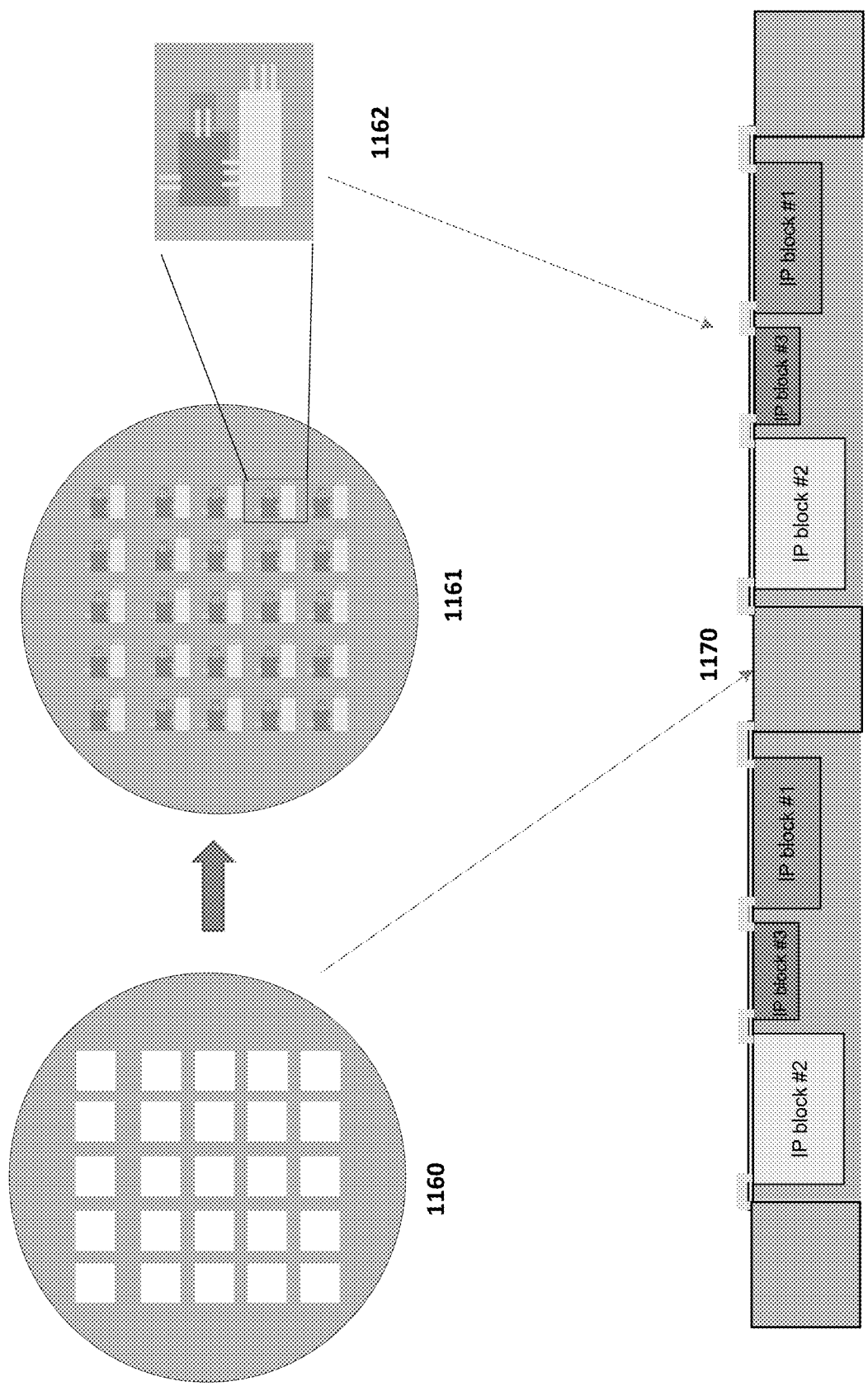
FIG. 11 illustrates multi-scale integration of dies, chips and IP blocks into a single packaged module with integrated heat spreader, according to an embodiment of the present disclosure.

FIG. 11 illustrates multi-scale integration of dies 1160, chips 1161 and IP blocks 1162 into a single packaged module 1170 with integrated heat spreader, according to an embodiment of the present disclosure. This recursive module integration process described above allows for a very large scale integration while simultaneously addressing the thermal issues that come with large scale integration. This also provides for a scalable approach with built-in thermal spreaders.

Examples of packaging form materials include Silicon, quartz, PolyChlorinated Biphenyls (PCB), FR4, SiC, metal plates and various polymers. The preferred substrate thickness is around 200 um thick. The substrate thickness typically ranges from 50-3000 um and needs to be at least 1 um thicker than the thickest chip to be integrated. The substrate cavity size is typically at least 1 um larger than the chip array dimensions. The thickness of the recursive packaging substrate must be at least 1 micron thicker than the thickness of the thickest MECA sub-modules (packaging substrate in process 500 must be thicker than packaging substrate in process 100).

Examples of heat spreader materials include Copper, gold, silver, copper alloys, copper-diamond, copper-CNT, and other high thermal conductivity materials or composites known by experts in the field. The heat spreaders have thickness similar to the packaging substrate stated earlier. Heat spreaders are typically deposited using deposition techniques such as Electroplating/Electroforming.

Interconnect materials for both the processes 100 and 500 are materials with high electrical conductivity such as gold, copper or silver or combination alloys there-of for the conductors and BCB, SU-8, polyimide, air, SiO2, SiN and Al2O3 or combination there-of for the dielectric layers that feature low dielectric loss tangent. Interconnect materials used for conductors and dielectrics can vary in thickness from 0.1 to 500 um with a preferred thickness of 5 um for conductors and 3 um for dielectrics. The width/pitch can vary from 0.5 to 500 um (preferred 25 um). Deposition techniques such as electroplating, sputtering, or evaporation for the metallic conductors can be used. For the dielectrics, spin coating, PECVD or ALD processes can be used to deposit the dielectrics.

Carrier substrate materials can be silicon, glass or other materials with low surface roughness. The IC chips or macros can be made from SiC, Si, SiGe, GaAs, InP, alumina, PCB or other materials known in the art. The substrate can have width or length ranging from 0.025 mm to 25 mm and thickness ranging from 1 to 1000 um.

An example interconnect process described in step 550 for chip-to-chip or chip-to-board interconnects can use the following process steps and technologies or variants there-of: (1) Sputter a metal seed layer or membrane (example is Ti/Au for a thickness preferably of 200/1000 A with a range of 100-500 A to 500 to 10000 A respectively); (2) Spin coat and pattern a layer of photoresist; (3) Plate gold (preferably 3 um, with range from 1 to 10 um) to form metal 1 layer interconnects; (4) Strip resist and etch metal seed layer (e.g.: ion mill or wet etching); (5) Spin coat or deposit a dielectric layer (e.g., BCB, SU-8, SiO2, SiN) with thickness of 0.1 to 10 um (preferably 3 um); (6) Pattern the layer using photo-definition, or dry etch techniques to open up regions on the plated gold to be contacted from metal 1 layer interconnects to metal 2 layer interconnects; (7) Sputter a new metal seed layer; (8) Spin coat and pattern a layer of photoresist to create metal 2 layer; (9) Plate gold (preferably 5 um) with thickness ranging 0.5 to 500 um to form "metal 2 layer" interconnects; (10) Strip resist and etch metal seed layer.

The purposed technology in this disclosure offers methods to develop a low-cost and manufacturable wafer-level integration technology for various systems including RF subsystems. It addresses thermal management and other limitations in high-frequency subsystems featuring high-power-density active devices such as GaN devices and GaN RF MMIC circuits.

Compared to current technology, the technology offered in this disclosure offers several advantages. Currently, heterogeneously-integrated chip modules still rely on conventional wire bonding and die attach to connect to large discrete capacitors and resistors required for biasing and filtering. In contrast, the approach presented here relies on parallel processing and microfabrication technologies to integrate these modules with the discrete components, while addressing low loss interconnects with no wire bonds from the module to the RF boards. In addition, it offers integrated thermal management, where modules are embedded in high thermal conductivity heat spreaders. Another main advantage of the proposed concepts is the recursive nature of the process that allows multi-scale integration with integrated metal embedding techniques.

The concepts of this disclosure is applicable to a wide variety of companies and product lines and it can offer significant added value by direct and indirect cost savings, added functionalities which can increase customer base and market share, and opportunities for increased revenues. Two major applications of this technology are in cooling and integration (IP re-use for example) in high power RF front-ends and digital and analog mixed signal designs.

In particular configurations, it may be desirable to use process 500 described herein to integrate dies of different technology characteristics. In other configurations, the recursive nature of this process with the integrated heat spreader will support very large scale integration including discrete components, beyond the capabilities of today's technologies.

Modifications, additions, or omissions may be made to the systems, apparatuses, and methods described herein without departing from the scope of the technology. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. An assembly comprising:
   two or more component modules,
   wherein at least a first one of the component modules comprises a first embedded chip assembly, and at least a second one of the component modules comprises a second embedded chip assembly;
   a thermally conductive material,
   wherein the two or more component modules are embedded in the thermally conductive material; and
   interconnects coupling the two or more component modules to each other,
   wherein the first embedded chip assembly comprises at least two interconnected chips embedded in the thermally conductive material, and
   wherein the first embedded chip assembly further comprises a packaging substrate disposed at least partially around the at least two interconnected chips.

2. The assembly of claim 1, wherein the packaging substrate is disposed around the at least two interconnected chips, wherein the packaging substrate is made from one of silicon, quartz, PolyChlorinated Biphenyls (PCBs), Fiberglass reinforced epoxy laminates, Silicon Carbide (SiC) and polymer, and wherein the thermally conductive material provides a thermal heat sink.

3. The assembly of claim 1, wherein the packaging substrate is disposed around the at least two interconnected chips, wherein the packaging substrate is made of a material selected from silicon, quartz, PolyChlorinated Biphenyls (PCB), Silicon Carbide (SiC) and polymer.

4. The assembly of claim 1, wherein the second one of the component modules further comprises an integrated circuit chip.

5. The assembly of claim 1, wherein the two or more component modules have active faces, the interconnects coupling the active faces to each other.

6. The assembly of claim 5, further comprising discrete components connected to the two or more component modules by wire bonding, wherein the discrete components are elementary electronic devices constructed as single units, and wherein the assembly is electrically connected to a third embedded chip assembly.

7. A metal-embedded multi-module device comprising:
two or more component modules, wherein at least a first one of the component modules includes a first metal-embedded chip assembly and at least a second one of the component modules includes a second metal-embedded chip assembly;
a heat spreader material embedding the two or more component modules; and
interconnects between the two or more component modules, the interconnects being on a side of the two or more component modules;
wherein the first metal-embedded chip assembly comprises:
at least two chips embedded in the heat spreader material; and
a packaging substrate disposed at least partially around the at least two interconnected chips.

8. The device of claim 7, wherein the packaging substrate is made of a material selected from silicon, quartz, PolyChlorinated Biphenyls (PCB), Silicon Carbide (SiC) and polymer.

9. The device of claim 7, wherein the at least one of the component modules further includes at least one of an Integrated Circuit chip, a macro cell, and a die.

10. An assembly comprising:
a thermally conductive material;
a first embedded chip assembly comprising:
two or more chips embedded together in the thermally conductive material;
a packaging substrate disposed at least partially around the two or more chips; and
first interconnects electrically connecting the two or more chips to each other, wherein the first embedded chip assembly is embedded in the thermally conductive material;
a second embedded chip assembly embedded in the thermally conductive material; and
second interconnects electrically connecting the first embedded chip assembly to the second embedded chip assembly.

11. The assembly of claim 10, wherein the packaging substrate is made of a material selected from silicon, quartz, PolyChlorinated Biphenyls (PCB), Silicon Carbide (SiC) and polymer.

12. The assembly of claim 10, wherein the second embedded chip assembly comprises two or more chips embedded together in the thermally conductive material.

13. The assembly of claim 10, wherein the first embedded chip assembly has an active face opposite a back side, and wherein the thermally conductive material is electroplated on the backside of the first embedded chip assembly.

14. The assembly of claim 13, further comprising a discrete component, wherein the discrete component is one of: a resistor, a capacitor, and an inductor, and wherein the active face of the first embedded chip assembly is electrically connected to the discrete component by wire bonding.

15. The assembly of claim 14, wherein the first interconnects connect the two or more chips to the packaging substrate, and wherein the discrete component is disposed on the thermally conductive material.

16. A multilevel device comprising:
a first assembly having: at least two component modules, the component modules each comprising an embedded chip assembly;
a first packaging substrate, the at least two component modules being at least partially contained by the first packaging substrate;
a heat spreader material located at least partially around the at least two component modules and in the first packaging substrate; and
interconnects coupled between the component modules, the first packaging substrate associating with the interconnects,
wherein each embedded chip assembly comprises:
at least two chips embedded in the heat spreader material; and
a second packaging substrate disposed at least partially around the at least two interconnected chips.

17. The device of claim 16 wherein each of the component modules has a back side and a front side opposite of the back side, the interconnects connecting to the front side, the heat spreader material not being on the front sides of the at least two component modules.

18. The device of claim 16 wherein the at least two component modules comprise elements from diverse technologies, and wherein the interconnects connect to a delayered area of the component modules.

19. The device of claim 16, wherein the first and second packaging substrates are made of a material selected from silicon, quartz, PolyChlorinated Biphenyls (PCB), Silicon Carbide (SiC) and polymer.

20. The device of claim 16 wherein the interconnects connect to the first packaging substrate, the interconnects being suspended over the heat spreader material.

21. The device of claim 16, wherein the component modules each further comprise at least one of an Integrated Circuit chip, a macro cell, and a die.

22. The device of claim 16 wherein the at least two component modules comprise elements of different thicknesses.

23. The device of claim 16, wherein the at least two component modules are embedded in the heat spreader material.

24. The device of claim 16 wherein the heat spreader is metallic.

25. The device of claim 16 wherein the heat spreader material embeds the at least two component modules within the first packaging substrate and thereby achieves high density integration and thermal management of the device.

26. The device of claim 25 wherein the interconnects are comprised of conductors and dielectrics, the conductors being comprised of materials of high electrical conductivity, the dielectrics being comprised of one or a combination of BCB, SU-8, polyimide, air, $SiO_2$, SiN, and Al2O3 and wherein the interconnects are of a thickness between 0.1 and 500 micro meters.

27. The device of claim 25 wherein for each embedded chip assembly: the heat spreader material is located within the second packaging substrate, the interconnects connecting the at least two chips to the second packaging substrate.

28. The device of claim 27 further comprising additional assemblies mirroring at least in part the construction of the first assembly, wherein the additional assemblies are connected to the first assembly.

29. The device of claim 25 wherein the first assembly is connected to at least one other component, the at least one other component being at least one of a component module, resistor, capacitor, and an inductor, wherein the first packaging substrate at least partially surrounds the at least two component modules and the at least one other component, the heat spreader material being within the first packaging substrate and embedding the at least two component modules, the interconnects interconnecting the first packaging substrate and the at least two component modules and the at least one other component.

30. The device of claim 29 wherein the first assembly is connected to at least another one other component.

31. The device of claim 30, wherein the first packaging substrate at least partially surrounds the another one other component, the interconnects connecting the first assembly and the at least another one other component.

32. The device of claim 25 wherein the chips of each embedded chip assembly are at least two diced pieces of technology; the second packaging substrate disposed around the at least two pieces of technology; the heat spreader material being in the second packaging substrate and embedding the at least two diced pieces of technology; and the interconnects connecting the second packaging substrate and the at least two diced pieces of technology.

33. The device of claim 32 wherein the at least two diced pieces of technology are from different technologies.

34. The device of claim 32 wherein the at least two diced pieces of technology are from the same technology.

* * * * *